(12) United States Patent
BrightSky et al.

(10) Patent No.: US 9,882,126 B2
(45) Date of Patent: Jan. 30, 2018

(54) PHASE CHANGE STORAGE DEVICE WITH MULTIPLE SERIALLY CONNECTED STORAGE REGIONS

(71) Applicants: International Business Machines Corporation, Armonk, NY (US); Macronix International Co., Ltd, Hsin-Chu OT (TW)

(72) Inventors: Matthew J. BrightSky, Pound Ridge, NY (US); Huai-Yu Cheng, White Plains, NY (US); Wei-Chih Chien, Yorktown Heights, NY (US); Sangbum Kim, Yorktown Heights, NY (US); Chiao-Wen Yeh, Yorktown Heights, NY (US)

(73) Assignees: International Business Machines Corporation, Armonk, NY (US); Macronix International Co. Ltd, Hsin-Chu (TW)

( * ) Notice: Subject to any disclaimer, the term of this patent is extended or adjusted under 35 U.S.C. 154(b) by 0 days.

(21) Appl. No.: 15/095,023

(22) Filed: Apr. 9, 2016

(65) Prior Publication Data

US 2017/0294578 A1  Oct. 12, 2017

(51) Int. Cl.
*H01L 45/00* (2006.01)
*G11C 13/00* (2006.01)
*H01L 27/24* (2006.01)

(52) U.S. Cl.
CPC ...... *H01L 45/1233* (2013.01); *G11C 13/0004* (2013.01); *G11C 13/004* (2013.01); *G11C 13/0069* (2013.01); *H01L 27/2436* (2013.01); *H01L 27/2463* (2013.01); *H01L 45/065* (2013.01); *H01L 45/124* (2013.01); *H01L 45/126* (2013.01); *H01L 45/1253* (2013.01); *H01L 45/144* (2013.01)

(58) Field of Classification Search
CPC . H01L 27/24; H01L 27/2436; H01L 27/2463; H01L 45/06; H01L 45/065; H01L 45/1233; H01L 45/124; H01L 45/1253; H01L 45/144; H01L 45/1608; H01L 45/1641; H01L 45/1683; G11C 13/0004
See application file for complete search history.

(56) References Cited

U.S. PATENT DOCUMENTS

| 8,363,463 | B2 * | 1/2013 | Shih | ......... H01L 45/06 257/2 |
| 8,772,747 | B2 | 7/2014 | Cheng et al. | |

(Continued)

OTHER PUBLICATIONS

S.C. Lai et al., "A Scalable Volume-Confined Phase Change Memory Using Physical Vapor Deposition," Symposium on VLSI Technology Digest of Technical Papers, IEEE 2013.

(Continued)

*Primary Examiner* — Stephen W Smoot
(74) *Attorney, Agent, or Firm* — Law Office of Charles W. Peterson, Jr.; Louis J. Percello, Esq.

(57) ABSTRACT

A phase change storage device, Integrated Circuit (IC) chip including the devices and method of manufacturing IC chips with the devices. The device includes a phase change storage region with multiple phase change regions, e.g., two (2), of different phase change material serially-connected between said program/read line and a select device conduction terminal.

13 Claims, 7 Drawing Sheets

(56) References Cited

U.S. PATENT DOCUMENTS

| | | | |
|---|---|---|---|
| 2006/0077741 A1* | 4/2006 | Wang | G11C 11/56 365/222 |
| 2006/0209585 A1* | 9/2006 | Tanizaki | G11C 11/56 365/148 |
| 2008/0273378 A1* | 11/2008 | Philipp | G11C 11/56 365/163 |
| 2009/0279349 A1* | 11/2009 | Shih | H01L 27/2436 365/163 |
| 2011/0186798 A1 | 8/2011 | Kwon et al. | |
| 2013/0181182 A1* | 7/2013 | Perniola | G11C 13/0004 257/4 |

OTHER PUBLICATIONS

H. Y. Cheng et al., "Atomic-level engineering of phase change material for novel fast-switching and high-endurance PCM for storage class memory application," in 2013 IEEE International Electron Devices Meeting, 2013, pp. 30.6.1-30.6.4.

H. Y. Cheng et al., "Novel fast-switching and high-data retention phase-change memory based on new Ga—Sb—Ge material," in 2015 IEEE International Electron Devices Meeting, 2015, pp. 3.51-3.5.4.2015 IEDM.

P. Zuliani et al., "Overcoming Temperature Limitations in Phase Change Memories With Optimized $Ge_xSb_yTe_z$" IEEE Trans. Electro. Dev. 60, 4020 (2013).

* cited by examiner

PHASE CHANGE STORAGE DEVICE WITH MULTIPLE SERIALLY CONNECTED STORAGE REGIONS

BACKGROUND

Field of the Invention

The present invention is related to solid state storage and particularly to solid state storage cells with a phase change material storage element.

Background Description

Solid state, phase change materials that are chalcogen (Group VI elements such as sulfur (S), selenium (Se) and tellurium (Te)) alloys with at least one of germanium (Ge), arsenic (As), silicon (Si), and antimony (Sb) are known as chalcogenides and are well known. Chalcogenides exist in at least two different classifiable solid states or phases. The most extreme two states can be classified simply as amorphous and crystalline states with other less easily discernable states ranging between those two states. The amorphous state has a disordered atomic structure. The crystalline state generally is polycrystalline. Each state or phase has very different electrical properties. In its amorphous state, some chalcogenides have a resistivity high enough to be considered an insulator, i.e., it behaves an open circuit. In the crystalline state, the same material has a lower resistivity and may behave as a resistor. The resistivity of some of these materials may vary between amorphous and crystalline states by as much as 6 orders of magnitude.

Heating a chalcogenide to a particular temperature for a given time switches phases from one (e.g., amorphous phase) state to a second (e.g., crystalline phase) state. Reheating to another particular temperature and given time reverses phases from the second back to the first. So, phase change material may be selectively set and reset. As with anything that has two or more discernable and selectable states, each of the 2 stable states can be designated as a logic one and the other a logic zero. Thus, phase change material has found use in storage devices and particularly, for non-volatile storage, e.g., as a memory cell storage media.

For an ideal storage device, the storage material crystallizes rapidly at a relatively high crystallization temperature, and exhibits a large difference in resistance between crystalline and amorphous states. Rapid crystallization provides for a fast set time. The higher the crystallization temperature, the better data retention. The larger the resistivity difference, the easier it is to discern between states. So, ideally, the material acts as a short in the crystalline or on state and an open in the amorphous or off state: and stay amorphous until it is recrystallized intentionally. Moreover, especially for mass storage applications with millions or billions of individual cells, an ideal chalcogenide programming with relatively little to no current, and consuming relatively little power. Minimizing programming power requires minimal thermal conductivity at a low melting point, while minimizing programming current requires maximizing resistivity for joule heating. Unfortunately, these properties have variable ranges across state of the art phase change materials and no state of the art material is uniquely suitable for all applications, especially for use in mass storage cells.

Thus, there is a need for improved storage properties for phase change storage materials and more particularly for phase change storage materials with little resistance drift, a significant difference between set and reset states, and long retention times, especially for high density storage applications.

SUMMARY

A feature of the invention is a storage device with improved storage properties;

Another feature of the invention is a phase change storage device with a composite storage region that has a low resistance drift coefficient and long retention with a high reset/set ratio;

Yet another feature of the invention is a phase change storage device with a composite storage region of multiple series-connected storage regions that combine for a low resistance drift coefficient and long storage retention time with a high reset/set ratio for improved read performance and without requiring sensitive read circuits or sense amplifiers.

The present invention relates to a phase change storage device, Integrated Circuit (IC) chip including the devices and method of manufacturing IC chips with the devices. The device includes a phase change storage region with multiple phase change regions, e.g., two (2), of different phase change material serially-connected between said program/read line and a select device conduction terminal.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION

Figure 1A:
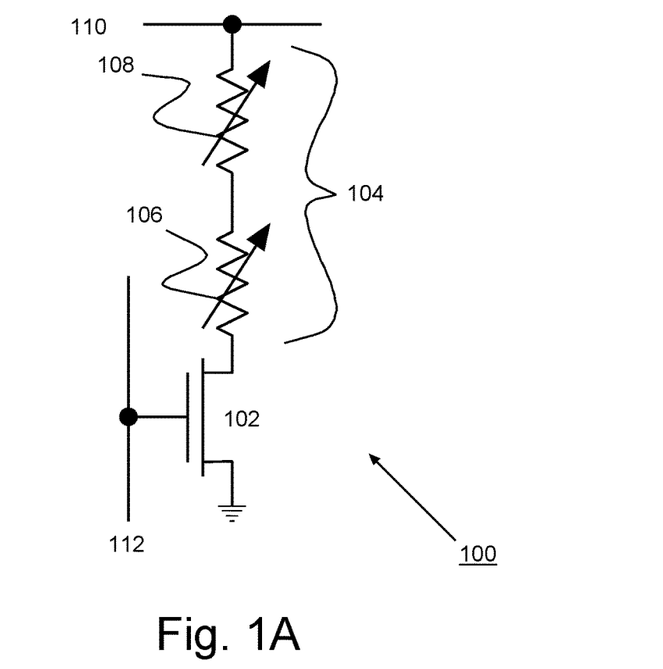
FIGS. 1A-B show an example of a multi-material phase change storage device and a programming characteristic for programming the device.
Figure 1B:
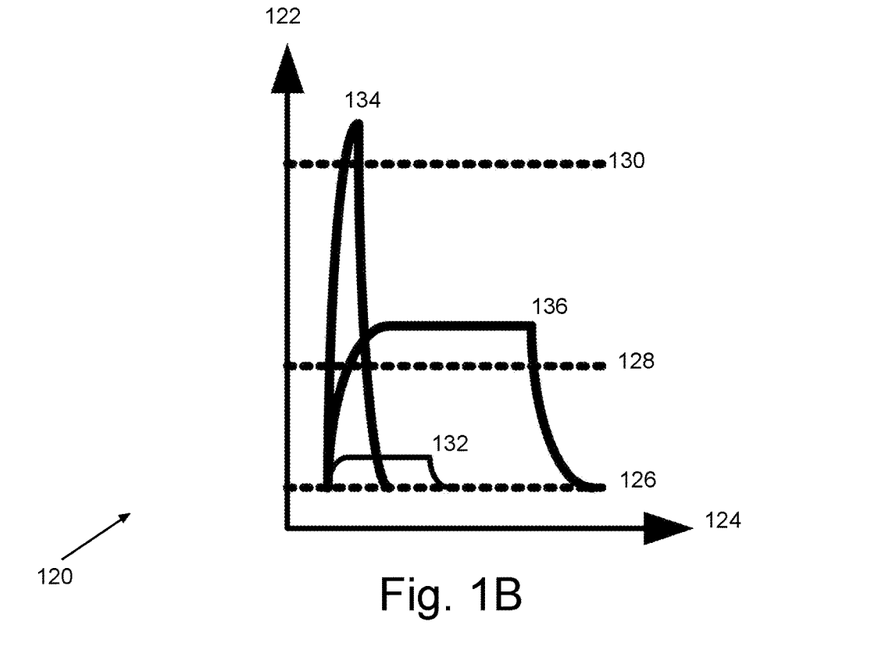

Turning now to the drawings and more particularly FIGS. 1A-B show an example of a multi-material phase change storage device 100 and a programming characteristic 120 for programming the device 100 according to a preferred embodiment of the present invention. Preferred multi-material storage cells 100 may include a single select device 102 and a multiple or composite storage region 104. In this example, the composite storage region 104 includes two serially-connected regions 106, 108 of two different chalcogenide storage media. The composite storage region 104 is connected between a program/read line 110, e.g., a bit line, and the select device 102, which in this example is connected to ground at the other end. Although described herein with regard to standard insulated gate field effect transistor (FET) technology, the single select device 102 may be any suitable select device, e.g., a diode or a bipolar junction transistor (BJT) or a FET. A select line 112 gates the select device 102 both for programming, and for reading, the state of the composite storage region 104.

The serially-connected storage regions 106, 108 complement each other such that the result crystallizes rapidly with a relatively high crystallization temperature, and exhibits a large difference between crystalline and amorphous resistivities. For example, a first chalcogenide is selected for its high crystallization temperature and long retention time, allowing selection of a second that does not. At the same time, the second is selected for a large reset/set or off/on ratio (amorphous/crystalline resistivity ratio), to compensate for the first, which does not. The first is also selected for a much larger resistance drift coefficient than the second. Collectively, these serially-connected storage regions 106, 108 combine to provide a storage region 104 with a high crystallization temperature and long retention time, large on/off ratio and a moderate resistance drift coefficient.

The device programming characteristic 120 in FIG. 1B shows the effect of temperature 122 on the composite storage region 104 over time 124. Under normal operating conditions between accesses, the serially-connected storage region 104 is at an ambient temperature 126. The composite storage region 104 has a collective crystallization (or set) temperature 128 and amorphous melting point (or reset temperature) 130. During a normal, relatively short read 132 the select line 112 gates the select device 102 with the program/read line 110 charged at a pre-charge read voltage. The read 132 elevates the region 104 temperature somewhat, but not high enough to change states. During a reset 134, the select line 112 gates the select device 102 for a much shorter time, while the program/read line 110 is clamped to a reset voltage to joule heat the region 104 in excess of the melting point 130, turning crystal regions amorphous. Similarly, during a set 136 the select line 112 gates the select device 102 for a longer time, while the program/read line 110 is clamped to a set voltage to joule heat the region 104 to exceed the collective crystallization temperatures 128, re-crystallizing both amorphous regions. The read, set and rest program/read line 110 voltages are selected by design for acceptable performance and circuit conditions.

Figure 2A:
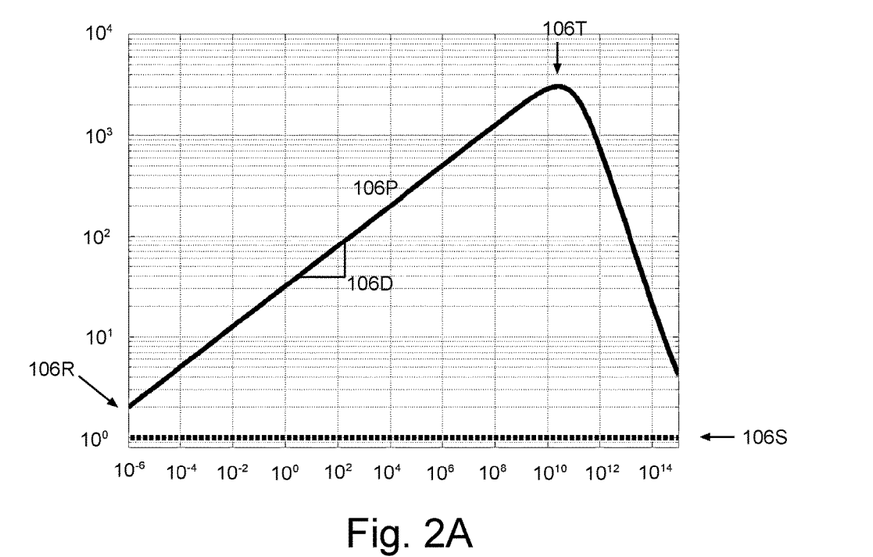
FIGS. 2A-B illustrate device storage properties for devices with individual phase change materials (normalized resistance over time) for exemplary materials combined in serially-connected storage regions for preferred multi-material phase change storage devices.
Figure 2B:
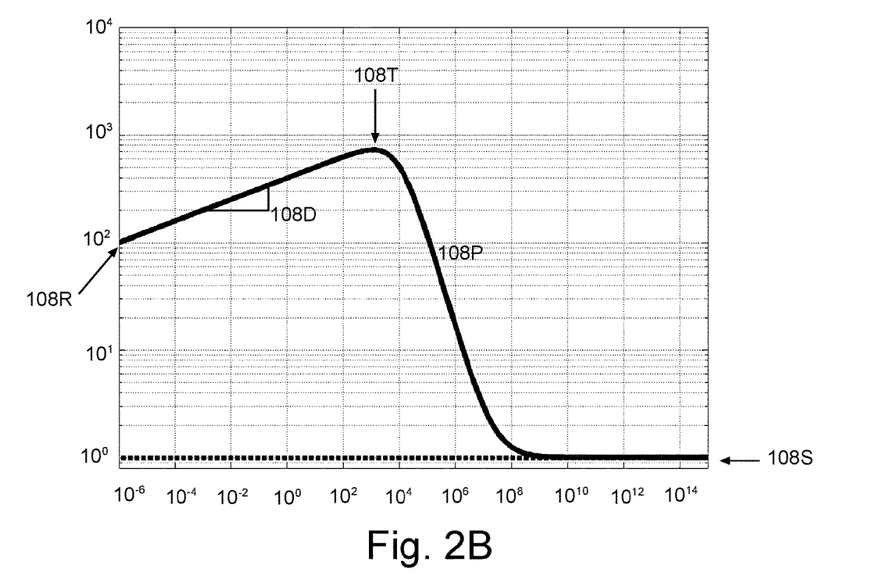

FIGS. 2A-B illustrate device storage properties for devices with individual phase change materials 106P, 108P (normalized resistance to the set resistance versus time) for exemplary materials combined in serially-connected storage regions 106, 108 in FIG. 1A for preferred multi-material phase change storage 100. In one preferred embodiment one storage material, e.g., 108, is germanium (Ge) antimony (Sb) tellurium (Te) silicon (Si) oxygen (O) compound (GeSbTeSiO) and the other 106 is a doped gallium (Ga) antimony germanium compound (GaSbGe), preferably silicon and oxygen doped. Alternately, storage material 108 may be doped GaSbGe and the other 106 may be GeSbTeSiO, Further any suitable material may be substituted for either or both materials 106, 108. The preferred Ge:Sb:Te:Si:O ratio is $17.8\pm0.5:22.2\pm5:41.6\pm5:4.4\pm0.5:14.0\pm0.5$, and the preferred doped Ga:Sb:Ge ratio is 23:30:47. Both materials have a normalized set resistance ($R_{set}$) 106S, 108S, at about 1.

The first material 106 has a relatively high crystallization temperature and low off, or reset, normalized resistance ($R_{reset}$) 106R, ~2. Consequently, the first material 106 has a reset/set ratio (~2) that is relatively small, which requires either more sensitive sensing, longer read times, or both. Advantageously, however, because resistance drift coefficient 106D (the characteristic 106P slope over the programmed range) is relatively high, with the short read pulse 132 of FIG. 1A, it has a long retention time 106T, $\sim 10^{10}$ seconds or about 300 years. By contrast the second material 108 has a much higher the normalized reset resistance 108R, ~100, for a much better reset/set ratio (~100). Unfortunately, even though the second material 108 has a very low resistance drift coefficient 108D, it also has a lower crystallization temperature, for a significantly shorter retention time 108T, about 100 seconds. However, each material 106, 108 exhibits some desired characteristics that the other does not.

Figure 3:
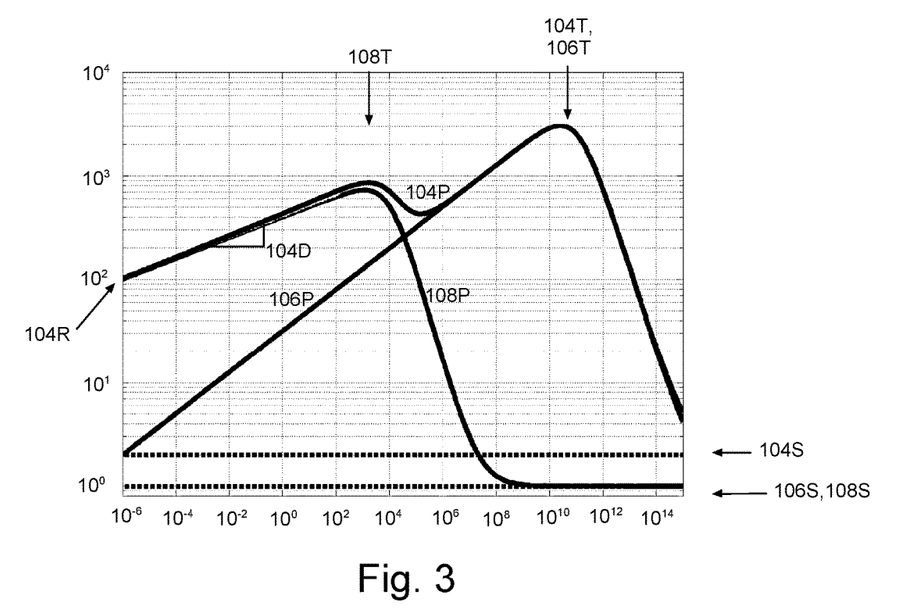
FIG. 3 show the cumulative device storage properties for a preferred multi-material phase change storage device.

FIG. 3 show the cumulative device storage properties 104P for a preferred multi-material phase change storage device 100 of FIG. 1, superimposed the individual device storage properties 106P, 108P of FIGS. 2A-B. Cumulatively, the higher reset resistance 108R dominates the serial multi-material phase change resistance 104R. Similarly, the reset resistance 104R and is much larger than the collective set resistance 104S, at least until the individual material 108 begins to recrystallize. Thus, the multi-material phase change storage region 104 has a reset/set ratio substantially similar to material 108, and effectively, a lower resistance drift coefficient 104D. When material 108 begins to recrystallize, however, the other material 106 remains amorphous with a resistance on the order of resistance of material 108. The composite storage region 104 only completely recrystallizes when that other material 106 recrystallizes much later. So, the composite storage region 104 exhibits a longer retention time 104T. Thus advantageously, the composite storage region 104 has a lower resistance drift coefficient 104D for both longer retention 104T (at 106T) and a high reset/set ratio for faster, less sensitive read times.

Figure 4:
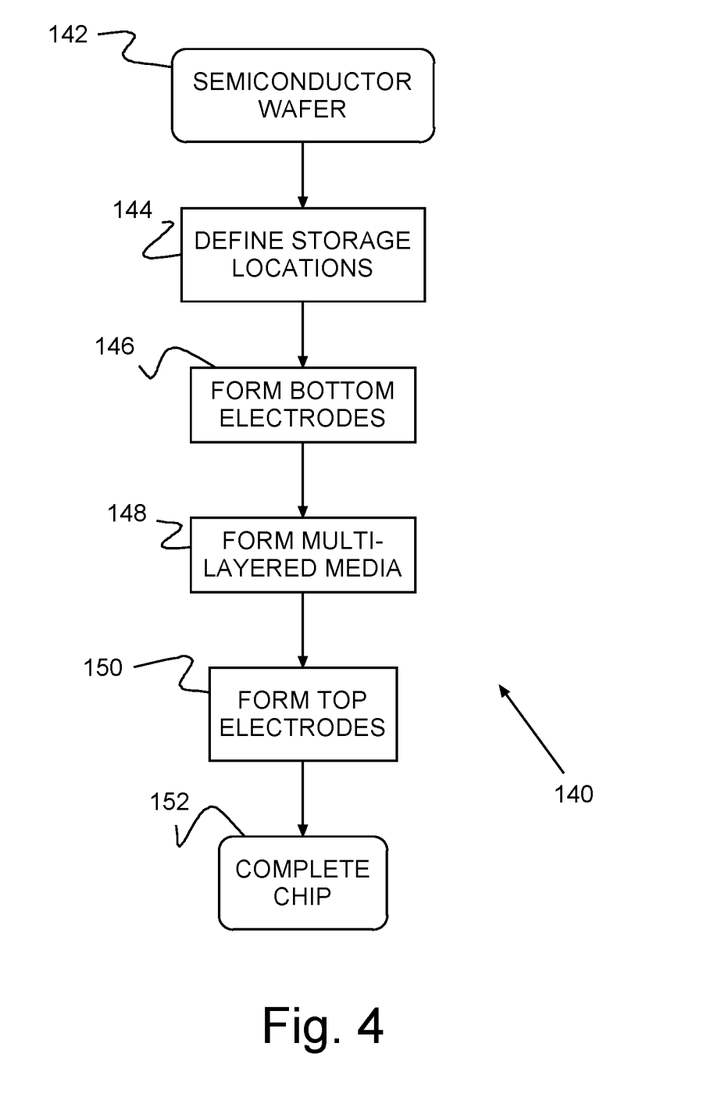
FIG. 4 shows a flow diagram for an example of a method of forming preferred embodiment multi-material phase change storage devices according to the present invention.
Figure 5A:
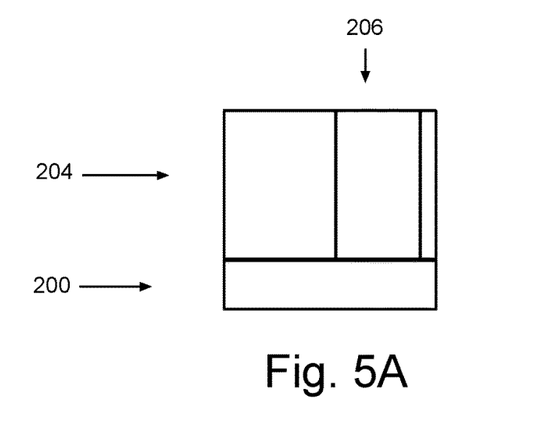
FIGS. 5A-D show a first cross sectional example of forming serially-connected storage regions.
Figure 5B:
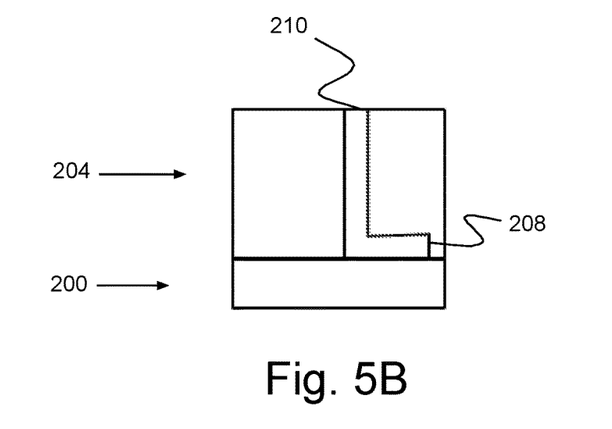
Figure 5C:
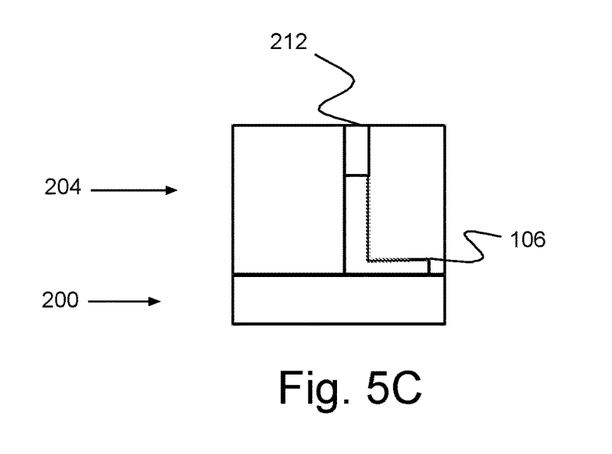
Figure 5D:
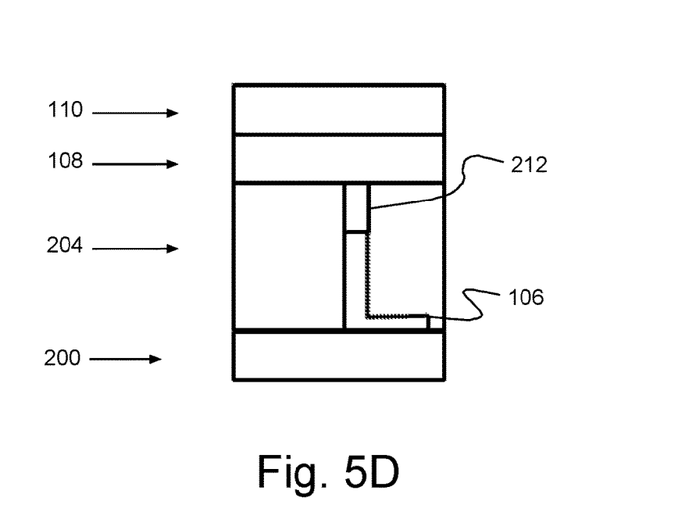

FIG. 4 shows a flow diagram for an example of a method 140 of forming preferred embodiment multi-material phase change storage devices 100 of FIG. 1, e.g., in a storage array on an integrated circuit (IC) chip, according to the present invention. In particular, preferred embodiment devices have multiple (at least 2) serially-connected chalcogenide phase change storage media regions 106, 108 in a composite storage region 104.

Cell formation begins in step 142 with a semiconductor wafer. The wafer may be a partially patterned with integrated circuits, e.g., with standard FET technology circuits and devices, at least some of which define 144 storage locations or cells. Storage cells are formed as described hereinbelow between 2 conductor layers, referred to as top and bottom electrode layers or electrodes. Further, circuit devices may be connected together by wiring that may be, in part, on one or in both of the 2 electrode layers. So, in step 146 bottom electrodes are formed. For example, for a storage array an array of electrodes may be formed in a conductor layer at the surface of the wafer after forming devices. Then in step 148, a composite storage region 104 is formed on each of the bottom electrodes. In step 150 the storage devices are completed when top electrodes are formed over the composite storage regions 104. Finally in step 152, using standard semiconductor manufacturing back end of the line (BEOL) steps, the chip circuits connected together and off chip and the IC is completed.

Figure 6:
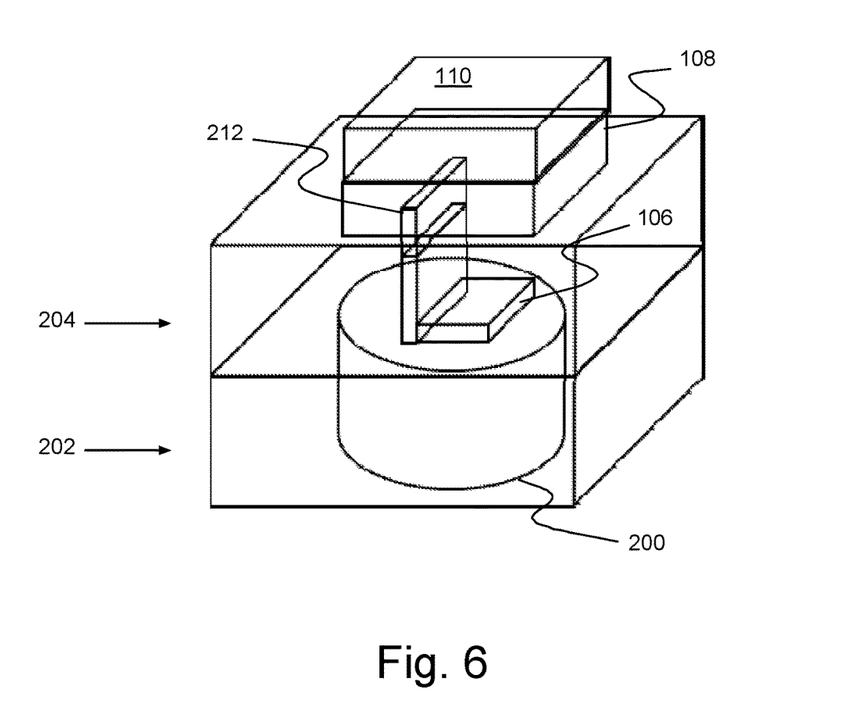
FIG. 6 shows the formed composite storage region in 3D.

FIGS. 5A-D show a first cross sectional example of forming serially-connected storage regions, e.g., 104 in FIG. 1, and FIG. 6 shows the formed composite storage region 104 in 3D with like features labeled identically. After defining select devices 102, a bottom electrode 200 is formed in a suitable insulator 202 (shown in FIG. 6), e.g., above or adjacent to, each select device 102. For example, the bottom electrode(s) 200 may be in a first wiring layer, in an upper wiring layer, or in a dedicated bottom electrode layer. The bottom electrodes 200 are a suitable metal, preferably tungsten (W) or titanium nitride (TiN), formed by a suitable metal definition step. After defining the bottom electrode(s) 200 an insulating layer 204 is formed on the wafer and trenches 206 are opened through the insulating layer 204 to each bottom electrode 200 for the first storage region 106.

In this example, the first storage region 106 is sidewall phase change storage media (PCM) 208 formed along a sidewall in each trench 206 and defined using a suitable, well known sidewall phase change storage media formation technique. Sidewall phase change storage media may be formed as described, for example, in S. C. Lai et al., "A Scalable Volume-Confined Phase Change Memory Using Physical Vapor Deposition," *Symposium on VLSI Technology Digest of Technical Papers*, IEEE 2013; and in published U.S. Patent Application No, 2011/0186798 to Kwon et al. Once the sidewall PCM 208 is formed and defined, the trench 206 is refilled with insulating material and the wafer is replanarized to the sidewall PCM 208. The top 210 of the sidewall PCM 208 is sub-etched to define the first storage region 106 and a barrier electrode 212 is formed in the sub etched region. The barrier electrode 212 may be any suitable metal that is non-reactive to the selected phase change materials. Preferably, the barrier electrode 212 is TiN or W, deposited and planarized, e.g., using a suitable chemical-mechanical polish (CMP).

Next, the second storage region(s) 108 is/are formed by forming a phase change storage media layer above the barrier electrode 212 and the upper electrode(s) or a program/read line 110 is(are) formed above the second storage region(s) 108. The second storage region 108 and the respective upper electrode 110 may be defined individually, or in a common definition step.

For example, the second storage region(s) 108 and upper electrode(s) 110 may be formed sequentially by first forming an insulating layer (not shown), masking and etching to define second storage region(s) 108. Then, depositing a layer of the second phase change storage media fills the etch pattern. After removing excess second phase change material, e.g., with another CMP step, the upper electrode(s) 110 are formed on the second storage material in region(s) 108, e.g., using a suitable metal deposition, mask and etch. Alternately, the second storage region(s) 108 and the upper electrode(s) 110 may be defined by depositing a second phase change material layer on the wafer and a metal layer on the second phase change material layer. Then, the upper electrode(s) 110 are defined, e.g., using a suitable mask and etch. Using the upper electrode(s) 110 as a mask, the second storage region(s) 108 are defined and an insulating layer (not shown) is formed around both the second storage region(s) 108 and the upper electrode(s) 110.

When both the storage regions 106, 108 are in the crystalline state, free of amorphous regions, collective storage region 104 resistance 104S is minimum as shown in FIG. 3. Subjecting the device to a reset pulse turns at least some portion of both storage regions 106, 108 amorphous. As reads occur, the amorphous regions in both storage regions 106, 108 remain amorphous, for about a minute (1 min) at 108T. After 108T the amorphous region in storage region 108 quickly recrystallizes. However, subsequent to 108T the amorphous region in other storage region 106 continues and resistance continues to increase. Thus, with the longer retention time 104T (at 106T) at ~$10^{10}$ seconds, or on the order of 300 years, the collective storage region 104, effectively, remains unswitched, at least until a set pulse recrystallizes the amorphous region in the second material as well.

Figure 7A:
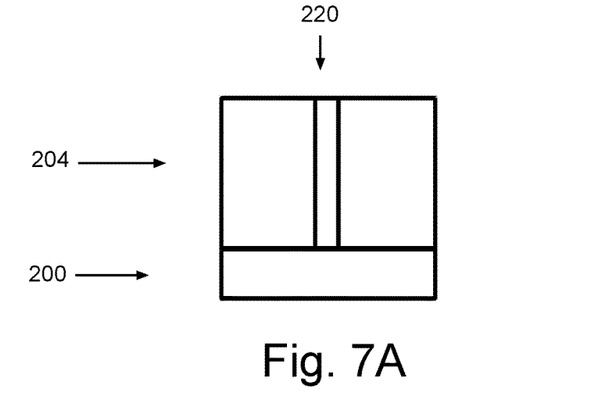
FIGS. 7A-C show a second cross sectional example of forming serially-connected storage regions.
Figure 7B:
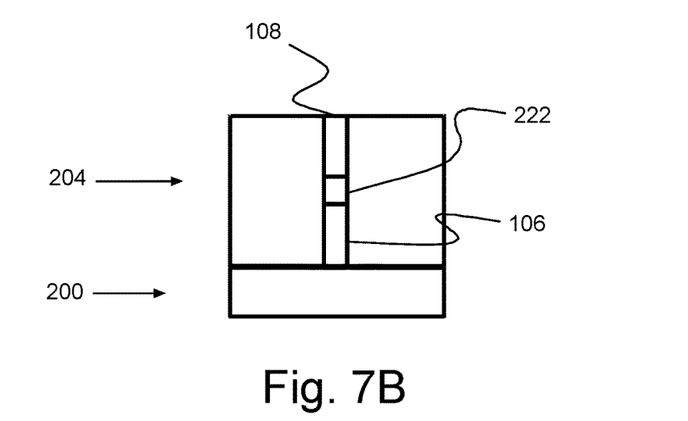
Figure 7C:
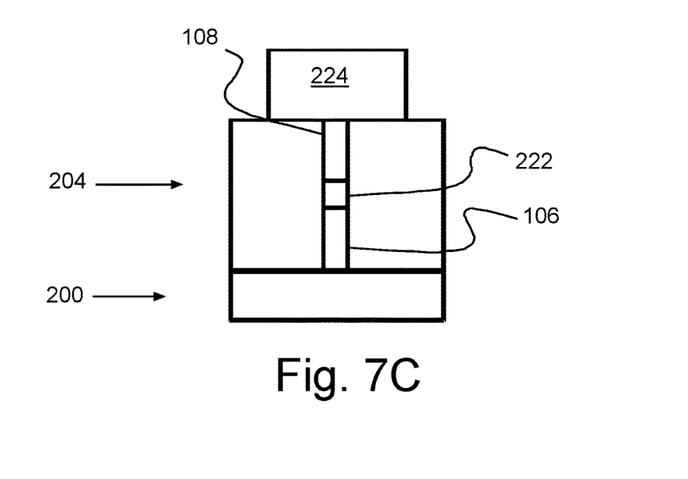

FIGS. 7A-C show a second cross sectional example of forming serially-connected storage regions 104 in FIG. 1. In this example, the serially-connected storage regions 104 are formed in pore 220, substantially similar to the example of FIGS. 5A-D with like features labeled identically. After defining select devices 102, a bottom electrode 200 and the insulating layer 204, a pore 220 is formed in the insulating layer 204. The pore 220 may be circular, square or rectangular. Preferably, the insulating layer 204 is formed above the bottom electrode 200 and the pore 220 is etched through the insulating layer 204 to the bottom electrode 200. Then, the first storage region 106, the barrier electrode 222, and the second storage region(s) 108 are formed in the pore 220, e.g., depositing each layer and etching or CMP. The upper electrode(s) 110 are defined on the second storage region(s) 108, e.g., also using a suitable mask and etch. Finally, an insulating layer (not shown) is formed on the upper electrode(s) 110, chip circuits are connected together and off chip and the IC is completed.

Figure 8:
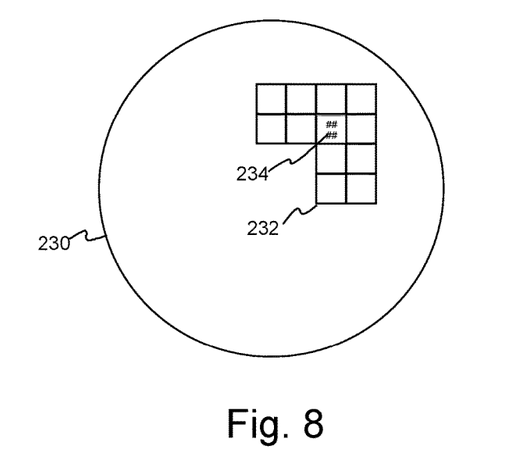
FIG. 8 shows an example of a wafer with completed IC chips after normal BEOL and chip definition.

FIG. 8 shows an example of a wafer 230 with completed IC chips 232 after normal BEOL and chip definition (152 in FIG. 4). After forming the insulating layer (not shown) on the upper electrode(s) 110, subsequent wiring layers are formed using a suitable metal formation process, e.g., in a dual damascene metal line formation step. The metal lines on upper layers (not shown) wire chip devices into chip circuits 234 and chip circuits 234 together.

Advantageously, preferred storage devices have a composite storage region that has a low resistance drift coefficient and long retention with a high reset/set ratio for faster read times without requiring sensitive read circuits or sense amps.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A phase change storage device comprising:
   a select device;
   a select line selectively turning said select device on and off;
   a program/read line; and
   a phase change storage region comprising a plurality of phase change regions of different phase change materials serially-connected between said program/read line and a conduction terminal of said select device, wherein said plurality of phase change regions comprises two phase change regions, a barrier electrode between said two phase change regions connecting one of said two to the other, and wherein said two phase change regions comprise a gallium antimony Germanium (GaSbGe) region and a germanium antimony tellurium (Te) silicon (Si) oxygen (O) compound (GeSbTeSiO) region.

2. A phase change storage device as in claim 1, wherein said phase change storage region comprises:
   a bottom electrode;
   a first phase change region on said bottom electrode;

said barrier electrode on an upper end of said first phase change region;

a second phase change regions on said barrier electrode; and a top electrode on said second phase change region.

3. A phase change storage device as in claim 2, wherein said conduction terminal is connected to said bottom electrode and said program/read line is connected to said top electrode.

4. A phase change storage device as in claim 3, wherein said phase change storage region is in a pore extending from said bottom electrode to said top electrode.

5. A phase change storage device as in claim 2, wherein said first phase change region is a sidewall first phase change region.

6. An Integrated Circuit (IC) chip including at least one phase change storage device as in claim 2.

7. An IC chip as in claim 6, wherein said at least one phase change storage device is a plurality of phase change storage devices, each phase change storage device being a phase change storage cell.

8. An IC chip as in claim 7 comprising a phase change storage array, said phase change storage array comprising a plurality of the phase change storage cells.

9. An Integrated Circuit (IC) chip including at least one phase change storage device, said phase change storage device comprising:

a select device;

a select line selectively turning said select device on and off;

a program/read line; and a phase change storage region comprising a plurality of phase change regions of different phase change materials serially-connected between said program/read line and a conduction terminal of said select device, wherein said plurality of phase change regions comprises two phase change regions, a barrier electrode between said two phase change regions connecting one of said two to the other, and wherein said two phase change regions comprise a gallium antimony Germanium (GaSbGe) region and a germanium antimony tellurium (Te) silicon (Si) oxygen (O) compound (GeSbTeSiO) region.

10. An IC chip as in claim 9, wherein said at least one phase change storage device is a plurality of phase change storage devices, each phase change storage device being a phase change storage cell.

11. An IC chip as in claim 10 comprising a phase change storage array, said phase change storage array comprising a plurality of the phase change storage cells, wherein said phase change storage region comprises:

a bottom electrode connected to said conduction terminal;

a first phase change region on said bottom electrode;

said barrier electrode on an upper end of said first phase change region;

a second phase change region on said barrier electrode; and a top electrode on said second phase change region and connected to said program/read line.

12. An IC chip as in claim 11, wherein said phase change storage region is in a pore extending from said bottom electrode to said top electrode.

13. An IC chip as in claim 11, wherein said first phase change region is a sidewall first phase change region.

* * * * *